(12) United States Patent
Maeta et al.

(10) Patent No.: US 9,837,296 B2
(45) Date of Patent: Dec. 5, 2017

(54) ELECTROSTATIC CHUCK APPARATUS

(71) Applicant: Sumitomo Osaka Cement Co., Ltd., Tokyo (JP)

(72) Inventors: Shinichi Maeta, Tokyo (JP); Yoshiaki Moriya, Tokyo (JP); Kei Furuuchi, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 661 days.

(21) Appl. No.: 13/718,071

(22) Filed: Dec. 18, 2012

(65) Prior Publication Data
US 2013/0265690 A1 Oct. 10, 2013

(30) Foreign Application Priority Data

Jun. 21, 2011 (JP) ................................. 2011-137387

(51) Int. Cl.
*H01L 21/683* (2006.01)
*H01L 21/67* (2006.01)

(52) U.S. Cl.
CPC .... *H01L 21/6831* (2013.01); *H01L 21/67248* (2013.01)

(58) Field of Classification Search
CPC ........... H01L 21/67248; H01L 21/6833; H01L 21/6831
USPC .......................................................... 361/234
See application file for complete search history.

(56) References Cited

U.S. PATENT DOCUMENTS

| 2005/0215073 A1* | 9/2005 | Nakamura et al. ........... 438/778 |
| 2006/0090855 A1* | 5/2006 | Kimura ............. H01L 21/67109 156/345.52 |
| 2008/0212255 A1* | 9/2008 | Miyaji ................ H01L 21/6831 361/234 |

FOREIGN PATENT DOCUMENTS

| JP | 2001151559 A | 6/2001 |
| JP | 2004315308 A | 11/2004 |
| JP | 2007251124 A | 9/2007 |
| JP | 2008-300491 | 12/2008 |

(Continued)

OTHER PUBLICATIONS

Japanese Patent Office, Reasons for Rejection issued in corresponding Japanese Patent Application No. 2011-137387 and English-language translation dated Jan. 20, 2015.

*Primary Examiner* — Zeev V Kitov
(74) *Attorney, Agent, or Firm* — Wood Herron & Evans LLP

(57) ABSTRACT

An electrostatic chuck apparatus is disclosed which can be prevented from being damaged or fractured when the temperature abruptly increases or decreases when plasma is irradiated on a plate-like specimen, the heater is heated, or the like, and can also prevent corrosion when a corrosive gas or plasma is provided. The electrostatic chuck apparatus has an electrostatic chuck portion 2 having a mounting plate 11 made of a corrosion-resistant ceramic, a supporting plate 12 which is integrated with the mounting plate 11 so as to support the mounting plate 11 and is made of an insulating ceramic having a larger thermal conductivity than the thermal conductivity of the corrosion-resistant ceramic, and an internal electrode for electrostatic adsorption 13 provided between the mounting plate 11 and the supporting plate 12; and a temperature-controlling base portion 3 which adjusts the electrostatic chuck portion 2 to a desired temperature.

16 Claims, 1 Drawing Sheet

(56) References Cited

FOREIGN PATENT DOCUMENTS

JP          2009184881  A      8/2009
JP          2011-176275       *  9/2011

* cited by examiner

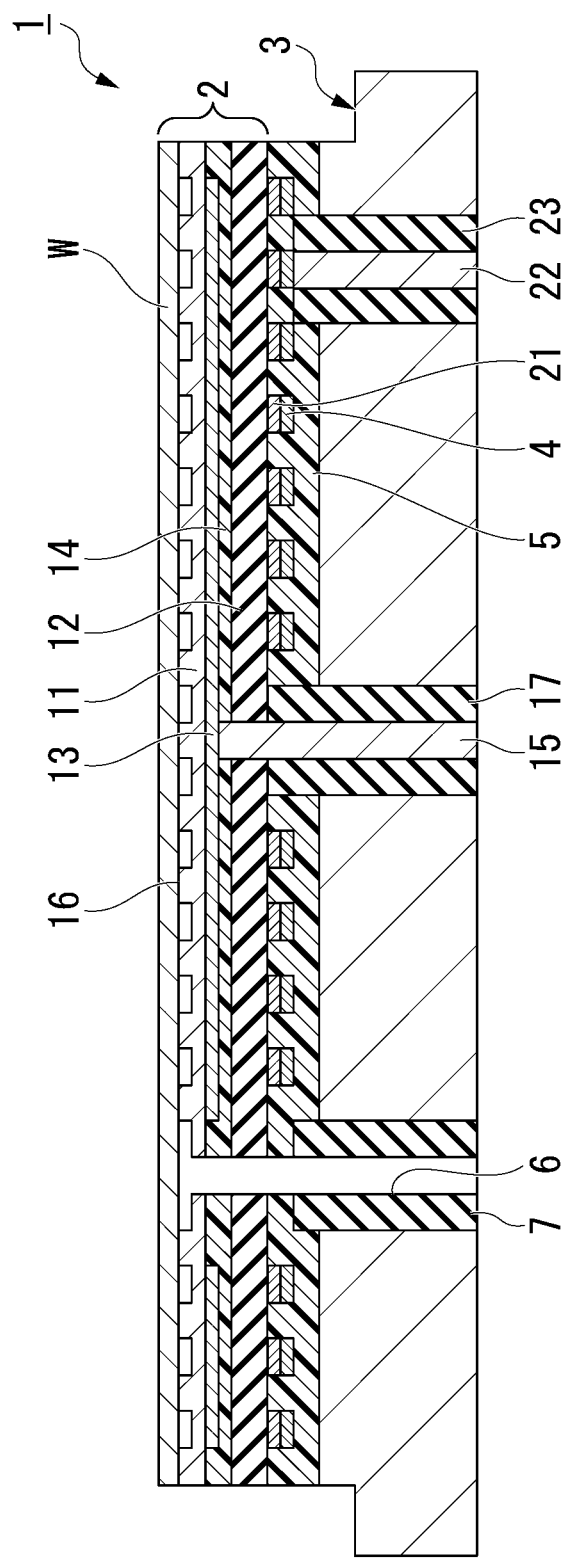

ELECTROSTATIC CHUCK APPARATUS

TECHNICAL FIELD

The present invention relates to an electrostatic chuck apparatus, and more specifically relates to an electrostatic chuck apparatus being preferably used when an electrostatic force is adapted for adsorbing and fixing a plate-like specimen such as a semiconductor wafer during a semiconductor manufacturing process including a variety of processes, such as a film-forming treatment using physical vapor deposition (PVD) or chemical deposition vapor (CVD), an etching treatment such as plasma etching, and an exposure treatment, so as to be able to increase the uniformity of the in-plane temperature on amounting surface on which the plate-like specimen is mounted, to prevent damage or fracture when the temperature abruptly increases or decreases, and furthermore to be able to improve corrosion-resistance with respect to corrosive gas or plasma.

BACKGROUND ART

In recent years, in semiconductor manufacturing processes, due to high integration and high performance of elements, there has been a demand for additional improvements in fine processing techniques. As semiconductor manufacturing processes, an etching technique is an important fine processing technique, and, in recent years, among etching techniques, a plasma etching technique which has a high efficiency and enables fine processing of a large area has become mainstream.

This plasma etching technique is one of dry etching techniques in which a fine pattern is formed in a solid material by forming a mask pattern on the solid material, which is a workpiece, using a resist; introducing a reactive gas into the vacuum where the solid material is supported in the vacuum; applying a high-frequency electric field to the reactive gas so as to make accelerated electrons collide with gas molecules and form a plasma state; reacting radicals (free radicals) and ions generated from this plasma with the solid material; and removing the reaction products.

Meanwhile, there is plasma CVD which is a thin film-growing technique in which raw material gases are combined using the action of plasma, and the obtained compound is deposited on a substrate. This method is a film-forming method in which a high-frequency electric filed is applied to a gas including raw material molecules so as to form plasma discharge, and the raw material molecules are decomposed using electrons accelerated by the plasma discharge, thereby depositing the obtained compound. A reaction which does not occur only by thermal excitation at a low temperature becomes possible in plasma because gases in the system collide with each other and are activated so as to become radicals.

In this semiconductor manufacturing process, there are processes in which halogen-based corrosive gases, such as fluorine-based corrosive gases or chlorine-based corrosive gases, or a plasma thereof are used, and, among the processes, a fluorine-based gas, such as $CF_4$, $SF_6$, HF, $NF_3$ or $F_2$ or a chlorine-based gas, such as $Cl_2$, $SiCl_4$, $BCl_3$ or HCl, is used in the processes of dry etching, plasma etching, and cleaning.

In the semiconductor manufacturing apparatus in which plasma is used, such as a plasma etching apparatus or a plasma DVD apparatus, an electrostatic chuck apparatus has been thus far used as an apparatus in which a wafer is easily attached and fixed to a specimen table, and the wafer is maintained at a desired temperature.

However, in a plasma etching apparatus of the related art, when plasma is irradiated on a wafer fixed to an electrostatic chuck apparatus, the surface temperature of the wafer increases. Therefore, a cooling medium, such as water, is made to circulate in a temperature-controlling base portion of the electrostatic chuck apparatus so as to cool the wafer from the bottom in order to suppress an increase in the surface temperature; however, at this time, a temperature distribution is generated in the surface of the wafer. For example, the temperature becomes high in the central portion of the wafer and becomes low at the edge side portions.

The difference in the in-plane temperature distribution is caused by the difference in the structure or system of a plasma etching apparatus and the like.

Therefore, a heater function-embedded electrostatic chuck apparatus having heating members attached between an electrostatic chuck portion and a temperature-controlling base portion is proposed (Patent Document 1).

This heater function-embedded electrostatic chuck apparatus can generate a local temperature distribution in a wafer, and therefore it is possible to efficiently carry out local film forming or local plasma etching, such as forming a pattern on the wafer, by setting the in-plane temperature distribution of the wafer in accordance with the film deposition rate or the plasma etching rate.

CITATION LIST

Patent Literature

[PTL 1] Japanese Laid-open Patent Publication No. 2008-300491

SUMMARY OF INVENTION

Technical Problem

However, in the electrostatic chuck apparatus of the related art, there was a problem in that, when plasma is irradiated on a wafer, the temperature abruptly increases or decreases, thermal stress is generated between the respective members during an increase or decrease in the temperature, and the electrostatic chuck apparatus is damaged and fractured in some cases.

In addition, even in the heater function-embedded electrostatic chuck apparatus, there was a problem in that the temperature abruptly increases or decreases when heating with the heater or irradiating a wafer with plasma, thermal stress is generated between the respective members during an increase or decrease in the temperature, and the electrostatic chuck apparatus is damaged and fractured in some cases.

Furthermore, in processes of dry etching, plasma etching, cleaning, and the like, since a corrosive gas, such as a fluorine-based gas or a chlorine-based gas, is used, there was a problem of the electrostatic chuck apparatus being corroded due to the corrosive gas or plasma.

The invention has been made in consideration of the above circumstances, and an object of the invention is to provide an electrostatic chuck apparatus which can prevent damage or fracture in a case in which the temperature abruptly increases or decreases when plasma is irradiated on a plate-like specimen, such as a wafer, the heater is heated, or the like, and also can prevent corrosion due to a corrosive gas or plasma.

Solution to Problem

As a result of intensive studies for solving the above problems, the present inventors found that, when a mounting plate of an electrostatic chuck portion is configured of a corrosion-resistant ceramic, when a supporting plate which is integrated with the mounting plate and supports the mounting plate is configured of an insulating ceramic having a larger thermal conductivity than the corrosion-resistant ceramic, and when the mounting plate and the supporting plate are integrated with an internal electrode for electrostatic adsorption sandwiched therebetween, it is possible to increase the uniformity of the in-plane temperature on the mounting plane on which a plate-like specimen is mounted, it is not concerned with damage or fracture occurring even when the temperature abruptly increases or decreases, and it is possible to prevent corrosion due to a corrosive gas or plasma, and the present inventors completed the invention.

That is, the electrostatic chuck apparatus of the invention has an electrostatic chuck portion having a mounting plate made of a corrosion-resistant ceramic which has one main surface used as amounting surface on which a plate-like specimen is mounted, a supporting plate which is integrated with the mounting plate so as to support the mounting plate and is made of an insulating ceramic having a larger thermal conductivity than the corrosion-resistant ceramic, and an internal electrode for electrostatic adsorption provided between the mounting plate and the supporting plate; and a temperature-controlling base portion which adjusts the electrostatic chuck portion to a desired temperature.

In the electrostatic chuck apparatus, since the mounting plate having one main surface used as amounting surface on which a plate-like specimen is mounted is configured of a corrosion-resistant ceramic, and the supporting plate which is integrated with the mounting plate so as to support the mounting plate is configured of an insulating ceramic having a larger thermal conductivity than the corrosion-resistant ceramic; the uniformity of the in-plane temperature on the mounting surface on which a plate-like specimen is mounted is increased, and the occurrence of damage or fracture is prevented even when the temperature abruptly increases or decreases. Thereby, the durability of the electrostatic chuck portion improves.

In the electrostatic chuck apparatus of the invention, the corrosion-resistant ceramic is composed of one or more selected from the group consisting of yttrium aluminum oxide composite oxides, rare earth element-added yttrium aluminum oxide composite oxides, and yttrium oxides.

In the electrostatic chuck apparatus, when the corrosion-resistant ceramic is configured of one or more selected from the group consisting of yttrium aluminum oxide composite oxides, rare earth element-added yttrium aluminum oxide composite oxides, and yttrium oxides, the corrosion resistance with respect to corrosive gases or plasma improves. Thereby, the durability of the electrostatic chuck portion is further improved.

In the electrostatic chuck apparatus of the invention, heating members are provided between the supporting plate and the temperature-controlling base portion, and the heating members are embedded in an organic insulating adhesive layer.

In the electrostatic chuck apparatus, when heating members provided between the supporting plate and the temperature-controlling base portion is embedded in an organic insulating adhesive layer, the organic insulating adhesive layer functions as a buffering layer which alleviates abrupt expansion and contraction of the supporting plate and the temperature-controlling base portion even when the temperature abruptly increases or decreases, and the occurrence of damage or fracture in the supporting plate is prevented. Thereby, the durability of the electrostatic chuck portion is further improved.

In the electrostatic chuck apparatus of the invention, the thickness of the mounting plate is 0.3 mm to 2.0 mm.

In the electrostatic chuck apparatus, when the thickness of the mounting plate is 0.3 mm to 2.0 mm, sufficient strength is supplied to the mounting plate, and the thermal capacity of the electrostatic chuck portion including the mounting plate decreases thereby obtaining an excellent heat exchange efficiency and thermal responsiveness to a mounted plate-like specimen.

Advantageous Effects of Invention

According to the electrostatic chuck apparatus of the invention, since the apparatus includes the mounting plate made of a corrosion-resistant ceramic which has one main surface used as a mounting surface on which a plate-like specimen is mounted, and the supporting plate which is integrated with the mounting plate so as to support the mounting plate and is made of an insulating ceramic having a larger thermal conductivity than the corrosion-resistant ceramic; it is possible to increase the uniformity of the in-plane temperature on the mounting surface on which a plate-like specimen is mounted, and to prevent the occurrence of damage or fracture even when the temperature abruptly increases or decreases. As a result, it is possible to further improve the durability of the electrostatic chuck portion.

In addition, since the corrosion-resistant ceramic is composed of one or more selected from the group consisting of yttrium aluminum oxide composite oxides, rare earth element-added yttrium aluminum oxide composite oxides, and yttrium oxides, it is possible to improve the corrosion resistance with respect to corrosive gases or plasma improves. As a result, it is possible to further improve the durability of the electrostatic chuck portion.

In addition, since heating members provided between the supporting plate and the temperature-controlling base portion is embedded in an organic insulating adhesive layer, the organic insulating adhesive layer functions as a buffering layer which alleviates abrupt expansion and contraction of the supporting plate and of the temperature-controlling base portion even when the temperature abruptly increases or decreases, whereby it is possible to prevent the occurrence of damage or fracture in the supporting plate. As a result, it is possible to further improve the durability of the electrostatic chuck portion.

In addition, since the thickness of the mounting plate is 0.3 mm to 2.0 mm, it is possible to add a sufficient strength to the mounting plate. In addition, the thermal capacity of the electrostatic chuck portion including the mounting plate decreases, thereby obtaining an excellent heat exchange efficiency and thermal responsiveness to a mounted plate-like specimen.

BRIEF DESCRIPTION OF DRAWINGS

FIG. 1 is a cross-sectional view of an electrostatic chuck apparatus of an embodiment of the invention.

DESCRIPTION OF EMBODIMENTS

An embodiment of the electrostatic chuck apparatus of the invention will be described with reference to the accompanying drawings.

The embodiment is described in detail in order to better understand the purport of the invention, and does not limit the invention unless explicitly stated.

FIG. 1 is a cross-sectional view of an electrostatic chuck apparatus of the embodiment of the invention, in which electrostatic chuck apparatus 1 is configured mainly of a disk-like electrostatic chuck portion 2, a disk-like thick temperature-controlling base portion 3 which adjusts the electrostatic chuck portion 2 to be at a desired temperature, heating elements (heating members) 4 provided between the electrostatic chuck portion 2 and the temperature-controlling base portion 3, and an organic insulating adhesive layer 5 in which the heater element 4 is embedded and which integrally adheres to the electrostatic chuck portion 2 and the temperature-controlling base portion 3.

The electrostatic chuck portion 2 is configured of a mounting plate 11 having a top surface which is used as amounting surface on which a plate-like specimen W, such as a semiconductor wafer, is mounted; a supporting plate 12 which is integrated with the mounting plate 11 so as to support the mounting plate 11; an internal electrode for electrostatic adsorption 13 provided on the bottom surface of the mounting plate 11; a resin-based insulating adhesive layer 14 which integrally adheres to the mounting plate 11, the internal electrode for electrostatic adsorption 13, and the supporting plate 12; and a power supply terminal 15 which is provided so as to penetrate the supporting plate 12 and which applies a direct voltage to the internal electrode for electrostatic adsorption 13.

The mounting plate 11 is configured to have a plurality of protrusion portions 16 which each have a diameter smaller than the thickness of the plate-like specimen W formed on the mounting plane, which is the top surface, so that the protrusion portions 16 support the plate-like specimen W; and is configured of a corrosion-resistant ceramic made of one or more selected from a group consisting of yttrium aluminum oxide composite oxides, rare earth element-added yttrium aluminum oxide composite oxides, and yttrium oxides ($Y_2O_3$). The shape of the corrosion-resistant ceramic may be a plate-like form made of only one of the above, or may be a laminate-structured plate-like form formed by laminating two or more of the above.

Examples of the yttrium aluminum oxide composite oxides include yttrium aluminum garnet (YAG: $Y_3Al_5O_{12}$), $Y_2O_3 \cdot Al_2O_3$, $Y_2O_3$—$Al_2O_3$ complex phases, and the like.

Examples of the rare earth element (RE)-added yttrium aluminum oxide composite oxides include composite oxides formed by adding to the yttrium aluminum oxide composite oxides with a rare earth element (RE) made of one or more selected from a group consisting of lanthanum (La), selenium (Se), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), or an oxide of the rare earth elements (RE).

Especially, selenium oxide ($Se_2O_3$)-added yttrium aluminum garnet (YAG.Se), neodymium oxide ($Nd_2O_5$)-added yttrium aluminum garnet (YAG.Nd), samarium oxide ($Sm_2O_3$)-added yttrium aluminum garnet (YAG.Sm), gadolinium oxide ($Gd_2O_3$)-added yttrium aluminum garnet (YAG.Gd), and the like are preferable.

The additive ratio of the rare earth element (RE) or the oxide of the rare earth element (RE) added to the yttrium aluminum oxide composite oxide in the rare earth element (RE)-added yttrium aluminum oxide composite oxide is preferably 0.01 mass % to 20 mass % and more preferably 5 mass % to 10 mass % with respect to the total amount of the yttrium aluminum oxide composite oxide.

When the additive ratio of the rare earth element (RE) is in the above range, the corrosion resistance of the rare earth element (RE)-added yttrium aluminum oxide composite oxide with respect to halogen gas or plasma improves.

The thickness of the mounting plate 11 is preferably 0.3 mm to 2.0 mm. The reason is that, when the thickness of the mounting plate 11 is below 0.3 mm, the risk of discharge due to voltage applied to the internal electrode for electrostatic adsorption 13 increases, and, when the thickness exceeds 2.0 mm, it is not possible to sufficiently adsorb and fix the plate-like specimen W, and therefore it becomes difficult to sufficiently heat the plate-like specimen W.

The supporting plate 12 is a disk-like member having a shape which is the same as the shape of a surface, which is overlapped thereon, of the mounting plate 11, and is configured of an insulating ceramic having a larger thermal conductivity than the corrosion-resistant ceramic which configures the mounting plate 11.

The thermal conductivity of the insulating ceramic may be at least 20 W/mK or more since the thermal conductivity of the corrosion-resistant ceramic which configures the mounting plate 11 is less than 20 W/mK.

Examples of an insulating ceramic having a thermal conductivity of 20 W/mK or more include ceramics such as aluminum oxide ($Al_2O_3$), aluminum nitride (AlN), aluminum oxide-silicon carbide ($Al_2O_3$—SiC), aluminum nitride (AlN) including 3 mass % to 7 mass % of yttrium oxide ($Y_2O_3$), or the like and which have mechanical strength and durability with respect to corrosive gases and plasma thereof.

The internal electrode for electrostatic adsorption 13 is used as an electrostatic chuck electrode for generating charges so as to fix the plate-like specimen W using an electrostatic adsorption force, and has the shape or size being appropriately adjusted depending on use.

The internal electrode for electrostatic adsorption 13 is formed of a conductive ceramic, such as an aluminum oxide-tantalum carbide ($Al_2O_3$—$Ta_4C_5$) conductive composite sintered compact, an aluminum oxide-tungsten ($Al_2O_3$—W) conductive composite sintered compact, an aluminum oxide-silicon carbide ($Al_2O_3$—SiC) conductive composite sintered compact, an aluminum nitride-tungsten (AlN—W) conductive composite sintered compact, an aluminum nitride-tantalum (AlN—Ta) conductive composite sintered compact or an yttrium oxide-molybdenum ($Y_2O_3$—Mo) conductive composite sintered compact; a high melting point metal, such as tungsten (W), tantalum (Ta) or molybdenum (Mo); or a high melting point metal-added conductive ceramic including the above high melting point metal in the above conductive ceramic as a filler.

The thickness of the internal electrode for electrostatic adsorption 13 is not particularly limited, but is preferably 0.1 μm to 100 μm, and particularly preferably 5 μm to 20 μm. The reason is that, when the thickness is below 0.1 μm, it is not possible to secure sufficient conductivity, and when the thickness exceeds 100 μm, the bonding interface between the internal electrode for electrostatic adsorption 13, the mounting plate 11 and the supporting plate 12 becomes liable to cracking due to the thermal expansion difference between the internal electrode for electrostatic adsorption 13, the mounting plate 11 and the supporting plate 12.

The internal electrode for electrostatic adsorption 13 which has the above thickness can be easily formed using a film-forming method, such as a sputtering method or a deposition method, or by a coating method such as a screen printing method.

The insulating adhesive layer 14 is a member which covers the internal electrode for electrostatic adsorption 13 so as to protect the internal electrode for electrostatic adsorption 13 from corrosive gases and plasma thereof, and integrally bonds the boundary portion between the mounting plate 11 and the supporting plate 12, that is, areas other than the internal electrode for electrostatic adsorption 13. As the insulating adhesive layer 14, a sheet-like or film-like adhesive resin having thermal resistance and insulation properties, such as a polyimide resin, a silicone resin or an epoxy resin, is preferably used.

The thickness of the insulating adhesive layer 14 is preferably 10 μm to 100 μm, and more preferably 20 μm to 40 μm. The variation in the in-plane thickness of the insulating adhesive layer 14 is preferably within 10 μm.

Here, when the variation in the in-plane thickness of the insulating adhesive layer 14 exceeds 10 μm, a variation exceeding 10 μm is caused in the in-plane gap between the mounting plate 11 and the supporting plate 12 when the mounting plate 11, the internal electrode for electrostatic adsorption 13, and the supporting plate 12 are integrally adhered, and, consequently, the in-plane temperature in the mounting surface of the mounting plate 11 becomes non-uniform, which is not preferable.

The total thickness of the mounting plate 11, the supporting plate 12, the internal electrode for electrostatic adsorption 13, and the insulating adhesive layer 14, that is, the thickness of the electrostatic chuck portion 2 is preferably 0.7 mm to 5.0 mm. The reason is that, when the thickness of the electrostatic chuck portion 2 is below 0.7 mm, it is not possible to ensure the mechanical strength of the electrostatic chuck portion 2, and, when the thickness of the electrostatic chuck portion 2 is above 5.0 mm, the thermal capacity of the electrostatic chuck portion 2 becomes too large, the thermal responsiveness of mounted the plate-like specimen W deteriorates, and, it becomes difficult to maintain the in-plane temperature of the plate-like specimen W in a desired temperature pattern due to an increase in the heat transmission in the transverse direction of the electrostatic chuck portion.

The power supply terminal 15 is a rod-like member provided to apply a direct voltage to the internal electrode for electrostatic adsorption 13. The material of the power supply terminal 15 is not particularly limited as long as the material is a conductive material having excellent thermal resistance, but a material having a similar thermal expansion coefficient to the thermal expansion coefficient of the internal electrode for electrostatic adsorption 13 and the supporting plate 12 is preferable, and examples thereof that can be preferably used include the conductive ceramic which configures the internal electrode for electrostatic adsorption 13 or metallic materials such as tungsten (W), tantalum (Ta), molybdenum (Mo), niobium (Nb) and cobalt alloys.

The power supply terminal 15 is insulated with respect to the temperature-controlling base portion 3 using an insulator 17 having insulation properties.

In addition, the power supply terminal 15 is integrally bonded to the supporting plate 12, and, the mounting plate 11 and the supporting plate 12 are integrally bonded together using the internal electrode for electrostatic adsorption 13 and the insulating adhesive layer 14, thereby configuring the electrostatic chuck portion 2.

The temperature-controlling base portion 3 is a member for adjusting the electrostatic chuck portion 2 to be at a desired temperature, and is a thick disk-like member.

Examples of the preferable temperature-controlling base portion 3 include a water-cooling base having a flow channel (not shown) through which water is circulated formed therein, and the like.

The material which configures the temperature-controlling base portion 3 is not particularly limited as long as the material is a metal having excellent thermal conductivity, electrical conductivity, and workability or is a compound material including such a metal, and examples thereof that can be preferably used include aluminum (Al), aluminum alloys, copper (Cu), copper alloys, stainless steel (SUS), and the like. It is preferable to carry out an alumite treatment or form an insulating film, such as alumina, on at least the surface of the temperature-controlling base portion 3 which is exposed to plasma.

The heating elements 4 are disposed on the bottom surface of the supporting plate 12 through an adhesive material 21, and are formed by etching a non-magnetic metal thin plate, such as for example, a titanium (Ti) thin plate, a tungsten (W) thin plate or a molybdenum (Mo) thin plate, having a thickness of 0.2 mm or less and preferably 0.1 mm or less into a desired heater pattern using a photolithography method.

Here, the reason for setting the thickness of the heating elements 4 to 0.2 mm or less is that, when the thickness exceeds 0.2 mm, the pattern shape of the heating elements 4 is reflected as a temperature distribution of the plate-like specimen W, and it becomes difficult to maintain the in-plane temperature of the plate-like specimen W in a desired temperature pattern.

In addition, when the heating elements 4 are formed of a non-magnetic metal, the heating elements do not heat themself using a high frequency even when the electrostatic chuck apparatus 1 is used in a high-frequency atmosphere, and, therefore, it becomes easy to maintain the in-plane temperature of the plate-like specimen W at a certain desired temperature or in a certain temperature pattern.

In addition, when the heating elements 4 are formed of a non-magnetic metal thin plate having a certain thickness, since the thickness of the heating elements 4 becomes uniform throughout the entire heated surface, and, since the amount of heat generation also becomes uniform throughout the entire heated surface, it is possible to make the temperature distribution of the mounting surface of the electrostatic chuck portion 2 uniform.

A power supply terminal 22 which supplies a direct voltage is connected to the heating elements 4, and the power supply terminal 22 is insulated with respect to the temperature-controlling base portion 3 using an insulator 23 having insulation properties.

The adhesive material 21 is a sheet-like or film-like adhesive resin having the same pattern shape as that of the heating elements 4, and the adhesive resin is preferably a resin having thermal resistance and insulation properties, such as a polyimide resin, a silicone resin, or an epoxy resin.

The thickness of the adhesive material 21 is preferably 5 μm to 100 μm, and more preferably 10 μm to 50 μm. The variation in the in-plane thickness of the adhesive material 21 is preferably within 10 μm.

Here, when the variation in the in-plane thickness of the adhesive material 21 exceeds 10 μm, a variation exceeding 10 μm is caused in the in-plane gap between the electrostatic chuck portion 2 and the heating elements 4, and, consequently, the in-plane uniformity of heat transmitted to the electrostatic chuck portion 2 from the heatings element 4 degrades and the in-plane temperature becomes non-uniform on the mounting surface of the electrostatic chuck portion 2, which is not preferable.

The organic insulating adhesive layer 5 integrally adheres to the heater element 4 and the temperature-controlling base portion 3 which is adhered to the bottom surface of the electrostatic chuck portion 2 through the adhesive material 21 in which the heating elements 4 and the temperature-controlling base portion 3 are made to face each other, and has an action of alleviating thermal stress. The organic insulating adhesive layer 5 is formed of, for example, a silicone resin produced by heating and curing a silicone-based resin composition or an acryl resin.

The thickness of the organic insulating adhesive layer 5 is preferably 50 μm to 500 μm.

Here, the reason for setting the thickness of the organic insulating adhesive layer 5 in the above range is that, when the thickness of the organic insulating adhesive layer 5 is below 50 μm, the thermal conductivity between the electrostatic chuck portion 2 and the temperature-controlling base portion 3 becomes favorable but thermal stress is not sufficiently alleviated, and breaking or cracking becomes liable to occur, and when the thickness of the organic insulating adhesive layer 5 exceeds 500 μm, it becomes impossible to sufficiently secure thermal conductivity between the electrostatic chuck portion 2 and the temperature-controlling base portion 3.

The organic insulating adhesive layer 5 is formed of, for example, a silicone resin formed by heating and curing a silicone-based resin composition or an acryl resin.

As the silicone resin, a resin having a Young's modulus of 8 MPa or less after curing is particularly preferable. Here, if the Young's modulus after curing exceeds 8 MPa, when heat is applied onto the organic insulating adhesive layer 5 in a cycle with temperature increases and temperature decreases, it is not possible to absorb the thermal expansion difference between the supporting plate 12 and the temperature-controlling base portion 3, and the durability of the organic insulating adhesive layer 5 degrades, which is not preferable.

The organic insulating adhesive layer 5 preferably contains a filler made of an inorganic oxide, an inorganic nitride, or an inorganic oxynitride having an average grain diameter of 1 μm to 10 μm, such as, for example, surface-coated aluminum nitride (AlN) particles in which a coated layer made of silicon oxide ($SiO_2$) is formed on the surfaces of aluminum nitride (AlN) particles.

These surface-coated aluminum nitride (AlN) particles are incorporated into the silicone resin in order to improve the thermal conductivity thereof, and therefore it is possible to control the thermal conductivity of the organic insulating adhesive layer 5 by adjusting the mixing ratio.

That is, it is possible to increase the thermal conductivity of an organic adhesive which configures the organic insulating adhesive layer 5 by increasing the mixing ratio of the surface-coated aluminum nitride (AlN) particles.

In addition, a coated layer made of silicon oxide ($SiO_2$) is formed on the surfaces of the aluminum nitride (AlN) particles, and therefore has excellent water resistance compared to simple aluminum nitride (AlN) particles whose surfaces are not coated. Therefore, it is possible to secure the durability of the organic insulating adhesive layer 5 containing a silicone-based resin composition as the major component, and, consequently, it is possible to significantly improve the durability of the electrostatic chuck apparatus 1.

In addition, since the surface-coated aluminum nitride (AlN) particles are aluminum nitride (AlN) particles whose surfaces are coated with a coating layer made of silicon oxide ($SiO_2$) having excellent water resistance, there is no concern that the aluminum nitride (AlN) may be hydrolyzed due to water in the atmospheric atmosphere and the thermal conductivity of aluminum nitride (AlN) may decrease, and the durability of the organic insulating adhesive layer 5 improves.

Meanwhile, there is no concern that the surface-coated aluminum nitride (AlN) particles may act as a contamination source of the plate-like specimen W, such as a semiconductor wafer, which makes the surface-coated aluminum nitride particles a preferable filler.

The surface-coated aluminum nitride (AlN) particles can obtain a strong bonding state using Si and the silicone-based resin composition in the coated layer, and therefore it is possible to improve the stretching properties of the organic insulating adhesive layer 5. Thereby, it is possible to alleviate thermal stress caused by the difference between the thermal expansion rate of the supporting plate 12 and the thermal expansion rate of the temperature-controlling base portion 3 in the electrostatic chuck portion 2, and it is possible to accurately and strongly adhere between the electrostatic chuck portion 2 and the temperature-controlling base portion 3. In addition, since the durability becomes sufficient with respect to the thermal cycle load while in use, the durability of the electrostatic chuck apparatus 1 improves.

The average grain diameter of the surface-coated aluminum nitride (AlN) particles is preferably 1 μm to 10 μm, and more preferably 2 μm to 5 μm.

Here, when the average grain diameter of the surface-coated aluminum nitride (AlN) particles is below 1 μm, the contact between the particles becomes insufficient, and, consequently, there is a concern that the thermal conductivity will degrade. In addition, when the grain diameter is too small, the workability such as handling degrades, which is not preferable, and when the average grain diameter exceeds 10 μm, variations in the thickness of the adhesion layer are likely to occur, which is not preferable.

In the electrostatic chuck apparatus 1, a hole 6 for allowing a cooling medium to flow into a groove formed between the protrusion portions 16 and the plate-like specimen W when the top surfaces of the protrusion portions 16 are used as the holding surface of the plate-like specimen W is punched, and the hole 6 penetrates the temperature-controlling base portion 3 through the insulator 7.

Next, a method of manufacturing the electrostatic chuck apparatus 1 will be described.

First, a plate-like mounting plate 11 was manufactured using any one of yttrium aluminum oxide composite oxides, rare earth element-added yttrium aluminum oxide composite oxides, and yttrium oxides ($Y_2O_3$).

For example, in a case in which an yttrium aluminum oxide composite oxide is used, yttrium oxide powder, aluminum oxide powder, and rare earth element oxide powder are mixed respectively in a predetermined ratio so as to produce a mixture.

In this case, a solvent, such as water or an alcohol, or a dispersant may be added as necessary.

In a method for mixing; an ultrasonic disperser; a disperser using resin-coated metal balls, agate balls, or the like as a media, such as a planetary ball mill, a ball mill or a sand mill; or a media-less disperser, such as an ultrahigh-pressure grinding disperser, is used. Particularly, since there is no concern that impurities may be included in the mixture, the media-less disperser is preferably used for an electrostatic chuck apparatus of a semiconductor manufacturing apparatus.

Next, the mixture is made into granules having a predetermined grain diameter using a granulating apparatus, such as an automatic mortar or a spray dryer, these granules are formed into a desired shape, the obtained compact is heated, for example, at 50° C. to 600° C. in the atmospheric atmosphere so as to dissipate (degrease) volatile components in the compact, and, subsequently, fired in any of an atmospheric atmosphere, a vacuum, an inert atmosphere, or a reducing atmosphere at 1000° C. to 1800° C., preferably 1500° C. to 1700° C., for 1 hour to 10 hours, whereby it is possible to obtain the mounting plate 11.

As a firing method, the compact may be fired at normal pressure as described above; however, in order to obtain a dense mounting plate 11, a pressurized firing method, such as hot press (HP) or hot isostatic press (HIP), is preferable.

The welding pressure in the pressurized firing method is not particularly limited, but is, generally, approximately 10 MPa to 40 MPa.

The sintered compact obtained in the above manner may be subjected to a heating treatment in either a vacuum or a reducing atmosphere at 1000° C. to 1800° C., preferably 1200° C. to 1600° C., for approximately 1 hour to 100 hours.

In addition, the plate-like supporting plate 12 is manufactured using any of aluminum oxide ($Al_2O_3$), aluminum nitride (AlN) and aluminum oxide-silicon carbide ($Al_2O_3$—SiC).

For example, in a case in which aluminum oxide ($Al_2O_3$) is used, aluminum oxide ($Al_2O_3$) is made into granules having a predetermined grain diameter using a granulating apparatus, such as an automatic mortar or a spray dryer, these granules are formed into a desired shape, the obtained compact is heated at, for example 50° C. to 600° C. in the atmospheric atmosphere so as to dissipate (degrease) volatile components in the compact, and, subsequently, fired in the atmospheric atmosphere at 1000° C. to 1800° C., preferably 1500° C. to 1700° C., for 1 hour to 10 hours, whereby it is possible to obtain the supporting plate 12.

Next, a plurality of fixing holes for tightly holding the power supply terminal 15 is formed in the supporting plate 12.

Next, the power supply terminal 15 is manufactured so as to obtain the size and shape of the power supply terminal which can be attached and fixed to the fixing holes in the supporting plate 12. Examples of a method of manufacturing the power supply terminal 15 include, in a case in which the power supply terminal 15 is made of a conductive composite sintered compact, a method in which conductive ceramic powder is formed into a desired shape, pressurized, and fired.

At this time, the conductive ceramic powder used for the power supply terminal 15 is preferably a conductive ceramic powder made of the same material as used for the internal electrode for electrostatic adsorption 13.

In addition, in a case in which the power supply terminal 15 is made of a metal, a method in which a high melting-point metal is used, the power supply terminal is formed using a grinding method, or a metal processing method, such as powder metallurgy, and the like, is used.

Next, a coating fluid for forming the internal electrode for electrostatic adsorption which contains a conductive material, such as the conductive ceramic powder, dispersed in an organic solvent is coated and dried on a predetermined area on the surface of the supporting plate 12 into which the power supply terminal 15 is fitted so as to come into contact with the power supply terminal 15, thereby producing the internal electrode for the electrostatic adsorption-forming layer.

As the coating method, a screen printing method or the like is desirably used since it is necessary to coat the coating fluid with a uniform thickness. In addition, a method in which a thin film of a high melting point metal is formed using a deposition method or a sputtering method and a method in which a thin plate made of the conductive ceramic or high melting point metal is disposed so as to produce an internal electrode for electrostatic adsorption-forming layer may also be used.

Next, the insulating adhesive layer 14 and the mounting plate 11 are sequentially overlapped on the internal electrode for electrostatic adsorption-forming layer on the supporting plate 12, and then the layers are integrated using a hot press at a high temperature and a high pressure. The atmosphere in the hot press is preferably a vacuum or an inert atmosphere of Ar, He, $N_2$, or the like. In addition, the pressure during uniaxial pressurization in the hot press is preferably 5 MPa to 10 MPa, and the temperature is preferably 1400° C. to 1850° C.

This hot press fires the internal electrode for electrostatic adsorption-forming layer so as to produce the internal electrode for electrostatic adsorption 13 made of a conductive composite sintered compact. At the same time, the supporting plate 12 and the mounting plate 11 are bonded and integrated together through the insulating adhesive layer 14.

In addition, the power supply terminal 15 is fired again using a hot press at a high temperature and a high pressure, and is attached and fixed to the fixing holes in the supporting plate 12.

In addition, the top and bottom surfaces, outer circumference, gas holes, and the like of the bonded body are mechanically processed so as to produce the electrostatic chuck portion 2.

Next, a sheet-like or film-like adhesive resin having thermal resistance and insulation properties, such as a polyimide resin, a silicone resin or an epoxy resin, and having the same pattern shape as that of the heating elements 4 is attached to a predetermined area on the surface (bottom surface) of the supporting plate 12 of the electrostatic chuck portion 2 so as to produce the adhesive material 21.

This adhesive material 21 can also be manufactured by attaching an adhesive resin sheet or an adhesive resin film having thermal resistance and insulation properties, such as a polyimide resin, a silicone resin or an epoxy resin to the surface (bottom surface) of the supporting plate 12, and forming the same pattern as that of the heating elements 4 on the sheet or film.

Next, a non-magnetic metal thin plate, such as a titanium (Ti) thin plate, a tungsten (W) thin plate or a molybdenum (Mo) thin plate, having a predetermined thickness of 0.2 mm or less and preferably 0.1 mm or less is attached to the adhesive material 21, and the non-magnetic metal thin plate is etched into a desired heater pattern using a photolithography method, thereby producing the heating elements 4.

Thereby, a heating element-embedded electrostatic chuck portion having the heating elements 4 having a desired heater pattern formed on the surface (bottom surface) of the supporting plate 12 through the adhesive material 21 is obtained.

Next, a power supply terminal 22 having a predetermined size and shape is manufactured. The power supply terminal 22 is manufactured using the same method as for the power supply terminal 15, and, for example, in a case in which the power supply terminal 22 is made of a conductive composite sintered compact, conductive ceramic powder is formed into a desired shape, pressurized and fired.

In addition, in a case in which the power supply terminal 22 is made of a metal, a high melting-point metal is used, and the power supply terminal is formed using a grinding method, a metal processing method, such as powder metallurgy, or the like.

A mechanical working is carried out on a metallic material made of aluminum (Al), an aluminum alloy, copper (Cu), a copper alloy, stainless steel (SUS), or the like; a flow channel through which water is circulated and the like are formed in the metallic material as necessary; and, furthermore, fixing holes for infixing and holding the power supply terminal 15 and the insulator 17 and fixing holes for infixing and holding the power supply terminal 22 and the insulator 23 are formed; thereby producing the temperature-controlling base portion 3.

It is preferable to carry out an alumite treatment or form an insulating film, such as alumina, on at least the surface of the temperature-controlling base portion 3 which is exposed to plasma.

Next, the bonding surface of the temperature-controlling base portion 3 with the electrostatic chuck portion 2 is degreased and washed using, for example, acetone, and then a sheet-like or film-like insulating adhesive resin having thermal resistance and insulation properties, such as a polyimide resin, a silicone resin or an epoxy resin, is attached to a predetermined location on the bonding surface, thereby producing the organic insulating adhesive layer 5.

Next, the heating element-embedded electrostatic chuck portion is overlapped on the temperature-controlling base portion 3 to which the organic insulating adhesive layer 5 is attached so that the heating elements 4 comes into contact with the organic insulating adhesive layer 5. At this time, the vertically provided power supply terminal 15, the insulator 17, the power supply terminal 22, and the insulator 23 are inserted and fitted in power supply terminal accommodation holes (not shown) punched in the temperature-controlling base portion 3.

Next, the electrostatic chuck portion 2 is pressed to the temperature-controlling base portion 3, and is adhered so as to be integrated to the temperature-controlling base portion 3 through the organic insulating adhesive layer 5 having the electrostatic chuck portion 2.

Thereby, the electrostatic chuck portion 2 and the temperature-controlling base portion 3 are bonded together so as to be integrated through the organic insulating adhesive layer 5, and the electrostatic chuck apparatus 1 of the embodiment is obtained.

EXAMPLES

Hereinafter, the invention will be described specifically using examples and comparative examples, but the invention is not limited by the examples.

Example 1

(Manufacturing of the Electrostatic Chuck Apparatus)

An electrostatic chuck portion 2 having a 20 μm-thick internal electrode for electrostatic adsorption 13 embedded inside was manufactured using a well-known method.

The mounting plate 11 of the electrostatic chuck portion 2 was an yttrium oxide ($Y_2O_3$) sintered compact, and had a disk shape having a diameter of 298 mm and a thickness of 0.5 mm. In addition, a large number of 40 μm-high protrusion portions 16 were formed on the electrostatic adsorption surface of the mounting plate 11 so as to produce an uneven surface, the top surfaces of the protrusion portions 16 were used as holding surfaces of a plate-like specimen W, and a cooling gas was allowed to flow through a groove formed between the recess portions and the electrostatically adsorbed plate-like specimen W.

In addition, the supporting plate 12 was an aluminum oxide ($Al_2O_3$) sintered compact, and had a disk shape having a diameter of 298 mm and a thickness of 2 mm.

The mounting plate 11 and the supporting plate 12 were bonded so as to be integrated, whereby the total thickness of the electrostatic chuck portion 2 became 2.5 mm.

Meanwhile, an aluminum temperature-controlling base portion 3 having a diameter of 350 mm and a height of 30 mm was manufactured using mechanical working. A flow channel (not shown) through which a coolant was circulated was formed in the temperature-controlling base portion 3.

Next, the surface (bottom surface) of the supporting plate 12 of the electrostatic chuck portion 2 was degreased and washed using acetone, a sheet adhesive made of a 20 μm-thick epoxy resin was attached to a predetermined area on the surface, thereby producing the adhesive material 21.

Next, a 100 μm-thick titanium (Ti) thin plate was mounted on the adhesive material 21. Next, the titanium thin plate was pressurized and held in a vacuum at 150° C., and the electrostatic chuck portion 2 and the titanium (Ti) thin plate were adhered together to be fixed.

Next, the titanium (Ti) thin plate was etched into a heater pattern having a predetermined shape using a photolithography method so as to produce heating elements 4. In addition, a titan power supply terminal 22 was vertically provided in the heating element 4 using a welding method.

Thereby, a heating element-embedded electrostatic chuck portion was obtained.

Next, the bonding surface of the temperature-controlling base portion 3 with the electrostatic chuck portion 2 was degreased and washed using acetone, and a 20 μm-thick sheet adhesive made of an epoxy resin was attached to a predetermined location on the bonding surface as the organic insulating adhesive layer 5.

Next, the heating element-embedded electrostatic chuck portion was overlapped on the temperature-controlling base portion 3 to which the sheet adhesive was attached, and the electrostatic chuck portion 2 was pressed to the temperature-controlling base portion 3 so as to bond the electrostatic chuck portion 2 and the temperature-controlling base portion 3, thereby manufacturing the electrostatic chuck apparatus 1 of Example 1.

(Evaluation)

The (1) thermal conductivity and (2) thermal expansion coefficient of the mounting plate and the supporting plate in the electrostatic chuck apparatus, and the (3) temperature uniformity, (4) thermal cycle test, and (5) corrosion resistance of the electrostatic chuck apparatus were each evaluated.

(1) Thermal Conductivity

Disk-like test specimens having a diameter of 10 mm and a thickness of 2 mm were cut out from each of the mounting plate and the supporting plate, and the thermal conductivity of the test specimens was measured using a laser flash method specified in Japanese Industrial Standards JIS R 1611 "Measurement methods of thermal diffusivity, specific heat capacity, and thermal conductivity for fine ceramics by flash method".

(2) Thermal Expansion Coefficient

The thermal expansion coefficients of the mounting plate and the supporting plate were measured using a thermal expansion coefficient measuring apparatus DL7000 (manufactured by ULVAC-RIKO, Inc.).

The measurement conditions were that the temperature was increased under an atmosphere of argon gas at a temperature-increase rate of 5° C./minute from room temperature (25° C.) to 1000° C., and the thermal expansion coefficient was computed therebetween.

(3) Temperature Uniformity

A 300 mm-diameter silicon wafer was electrostatically adsorbed on the mounting surface of the electrostatic chuck apparatus, was electrically connected to the heating elements while circulating cooling water at 20° C. through the flow channel (not shown) in the temperature-controlling base portion so as to make the center temperature of the silicon wafer reach 40° C., and the in-plane temperature distribution of the silicon wafer at this time was measured using a thermography TVS-200EX (manufactured by Nippon Avionics Co., Ltd.).

(4) Thermal Cycle Test

The electrostatic chuck apparatus was installed in a vacuum chamber, a silicon wafer was disposed on the mounting surface in a state in which the temperature-controlling base portion was maintained at a constant temperature of 20° C. using a fluorocarbon refrigerant, and a voltage of 4000 W was applied to the heating elements so as to intermittently heat the silicon wafer, thereby repeating a cycle in which the surface temperature of the silicon wafer changed between 40° C. to 100° C. a total of 1000 times.

After that, a direct voltage of 4000 V was applied between the internal electrode for electrostatic adsorption and the temperature-controlling base portion in the electrostatic chuck apparatus, the leakage current in the silicon wafer in this case was measured, the electrostatic chuck apparatus was determined to be not fractured in a case in which the leakage current was less than 1 mA (O in Table 1), and the electrostatic chuck apparatus was determined to be fractured in a case in which the leakage current was 1 mA or more.

In addition, for the electrostatic chuck apparatuses determined as fractured, the number of cycles at which the electrostatic chuck apparatus was fractured was investigated by gradually decreasing the number of repetitions of the cycle to, for example, 500 times, 200 times, and 100 times, and the number of cycles was used for the test results.

(5) Corrosion Resistance

The electrostatic chuck apparatus was exposed to plasma for 8 hours in a gas mixture of a halogen carbide-based gas, oxygen and argon, the exposed surface was observed using a scanning electron microscope (SEM), and the surface roughness of the mounting surface was evaluated.

The evaluation criteria are as follows.

○: No surface roughness is observed
Δ: Slight surface roughness is observed
x: Surface roughness is observed.

The evaluation results are shown in Table 1.

Example 2

An electrostatic chuck apparatus of Example 2 was manufactured according to Example 1 except that the mounting plate 11 of the electrostatic chuck portion 2 was made of yttrium aluminum garnet (YAG) instead of the yttrium oxide ($Y_2O_3$) sintered compact, and was evaluated.

The evaluation results are shown in Table 1.

Example 3

An electrostatic chuck apparatus of Example 3 was manufactured according to Example 1 except that the mounting plate 11 of the electrostatic chuck portion 2 was made of samarium oxide ($Sm_2O_3$)-added yttrium aluminum garnet (YAG.Sm) obtained by adding 10 mass % of samarium oxide ($Sm_2O_3$) to yttrium aluminum garnet (YAG) instead of the yttrium oxide ($Y_2O_3$) sintered compact, and was evaluated.

The evaluation results are shown in Table 1.

Example 4

An electrostatic chuck apparatus of Example 4 was manufactured according to Example 1 except that the mounting plate 11 of the electrostatic chuck portion 2 was made of gadolinium oxide ($Gd_2O_3$)-added yttrium aluminum garnet (YAG.Gd) obtained by adding 10 mass % of gadolinium oxide ($Gd_2O_3$) to yttrium aluminum garnet (YAG.Gd) instead of the yttrium oxide ($Y_2O_3$) sintered compact, and was evaluated.

The evaluation results are shown in Table 1.

Example 5

An electrostatic chuck apparatus of Example 4 was manufactured according to Example 1 except that the mounting plate 11 of the electrostatic chuck portion 2 was made of samarium oxide ($Sm_2O_3$)-added yttrium aluminum garnet (YAG.Sm) obtained by adding 10 mass % of samarium oxide ($Sm_2O_3$) to yttrium aluminum garnet (YAG) instead of the yttrium oxide ($Y_2O_3$) sintered compact, and the supporting plate 12 was made of an aluminum nitride (AlN) sintered compact instead of an aluminum oxide ($Al_2O_3$) sintered compact, and was evaluated.

The evaluation results are shown in Table 1.

Comparative Example 1

An electrostatic chuck apparatus of Comparative example 1 was manufactured according to Example 1 except that the mounting plate 11 and the supporting plate 12 of the electrostatic chuck portion 2 were both made of yttrium aluminum garnet (YAG), and was evaluated.

The evaluation results are shown in Table 1.

Comparative Example 2

An electrostatic chuck apparatus of Comparative example 2 was manufactured according to Example 1 except that the mounting plate 11 and the supporting plate 12 of the electrostatic chuck portion 2 were configured of an yttrium aluminum garnet (YAG) plate, and the internal electrode for electrostatic adsorption was embedded in the electrostatic chuck apparatus, and was evaluated.

The evaluation results are shown in Table 1.

Comparative Example 3

An electrostatic chuck apparatus of Comparative example 3 was manufactured according to Example 1 except that the mounting plate 11 and the supporting plate 12 of the electrostatic chuck portion 2 were both made of an aluminum oxide ($Al_2O_3$) sintered compact.

The evaluation results are shown in Table 1.

TABLE 1

|  | Mounting plate | | | Supporting plate | | | | |
| --- | --- | --- | --- | --- | --- | --- | --- | --- |
|  | Composition | Thermal conductivity (W/mK) | Thermal expansion coefficient | Composition | Thermal conductivity (W/mK) | Thermal expansion coefficient | Thermal uniformity (° C.) | Thermal cycle test | Corrosion resistance |
| Example 1 | $Y_2O_3$ | 14 | 7.9 | $Al_2O_3$ | 30 | 8.1 | 4 | ○ | ○ |
| Example 2 | YAG | 7 | 8.7 | $Al_2O_3$ | 30 | 8.1 | 4 | ○ | ○ |
| Example 3 | YAG - Sm | 7 | 8.8 | $Al_2O_3$ | 30 | 8.1 | 4 | ○ | ○ |
| Example 4 | YAG - Gd | 7 | 8.8 | $Al_2O_3$ | 30 | 8.1 | 4 | ○ | ○ |
| Example 5 | YAG - Sm | 7 | 8.8 | AlN | 90 | 4.3 | 2 | ○ | ○ |
| Comparative example 1 | YAG | 7 | 8.7 | YAG | 7 | 8.7 | 6 | Fractured by 500 cycles | ○ |
| Comparative example 2 | YAG | 7 | 8.7 | YAG | 7 | 8.7 | 6 | Fractured by 100 cycles | ○ |
| Comparative example 3 | $Al_2O_3$ | 30 | 8.1 | $Al_2O_3$ | 30 | 8.1 | 4 | ○ | x |

According to Table 1, the electrostatic chuck apparatuses of Examples 1 to 5 were superior to the electrostatic chuck apparatuses of Comparative examples 1 to 3 in terms of all of thermal conductivity, thermal expansion coefficient, temperature uniformity, thermal cycle test, and corrosion resistance.

Meanwhile, in Comparative example 1, the mounting plate 11 and the supporting plate 12 were both configured by yttrium aluminum garnet (YAG) having a low thermal conductivity of less than 20 W/Km and a weak mechanical strength, and therefore cracking or peeling occurred between the mounting plate 11 and the supporting plate 12.

In Comparative example 2, the mounting plate 11 and the supporting plate 12 were both configured by an yttrium aluminum garnet (YAG) plate having a low thermal conductivity of less than 20 W/Km and a weak mechanical strength, and therefore cracking occurred therein.

In Comparative example 3, since the mounting plate 11 was made of an aluminum oxide ($Al_2O_3$) sintered compact, the corrosion resistance was poor.

REFERENCE SIGNS LIST

1 ELECTROSTATIC CHUCK APPARATUS
2 ELECTROSTATIC CHUCK PORTION
3 TEMPERATURE-CONTROLLING BASE PORTION
4 HEATING ELEMENT (HEATING MEMBER)
5 ORGANIC INSULATING ADHESIVE LAYER
6 HOLE
7 INSULATOR
11 MOUNTING PLATE
12 SUPPORTING PLATE
13 INTERNAL ELECTRODE FOR ELECTROSTATIC ADSORPTION
14 RESIN-BASED INSULATING ADHESIVE LAYER
15 POWER SUPPLY TERMINAL
16 PROTRUSION PORTION
17 INSULATOR
21 ADHESIVE MATERIAL
22 POWER SUPPLY TERMINAL
23 INSULATOR
W PLATE-LIKE SPECIMEN

The invention claimed is:

1. An electrostatic chuck apparatus comprising:
an electrostatic chuck portion having a mounting plate made of a corrosion-resistant ceramic which has one main surface used as a mounting surface on which a plate-like specimen is mounted, a supporting plate which is integrated with the mounting plate so as to support the mounting plate and is made of an insulating ceramic having a larger thermal conductivity than the corrosion-resistant ceramic, and an internal electrode for electrostatic adsorption provided between the mounting plate and the supporting plate; and
a temperature-controlling base portion which adjusts the electrostatic chuck portion to a desired temperature,
wherein the corrosion-resistant ceramic is composed of one or more selected from a group of yttrium aluminum garnet (YAG: $Y_3Al_5O_{12}$), $Y_2O_3 \cdot Al_2O_3$, $Y_2O_3$—$Al_2O_3$, and rare earth element-added yttrium aluminum oxide composite oxides, which is a composite oxide formed by adding to the yttrium aluminum oxide composite oxides with a rare earth element (RE) made of one or more selected from a group consisting of lanthanum (La), selenium (Se), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), or an oxide of the rare earth elements (RE),
thickness of the mounting plate is 0.3 mm to 2.0 mm,
the supporting plate is composed of one or more selected from a group of aluminum oxide ($Al_2O_3$), aluminum nitride (AlN), aluminum oxide-silicon carbide ($Al_2O_3$—SiC), aluminum nitride (AlN) including 3 mass % to 7 mass % of yttrium oxide ($Y_2O_3$), and
an insulating adhesive layer is provided between the supporting plate and the internal electrode, having a variation in the in-plane thickness within 10 μm.

2. The electrostatic chuck apparatus according to claim 1, wherein heating members are provided between the supporting plate and the temperature-controlling base portion, and the heating members are embedded in an organic insulating adhesive layer.

3. The electrostatic chuck apparatus according to claim 1, wherein the mounting plate has a plurality of protrusion portions having a diameter smaller than the thickness of the plate-like specimen, formed on the mounting plate.

4. The electrostatic chuck apparatus according to claim 1, wherein the yttrium aluminum oxide composite oxide is one or more selected from the group consisting of yttrium aluminum garnet (YAG: $Y_3Al_5O_{12}$), $Y_2O_3 \cdot Al_2O_3$ and $Y_2O_3$—$Al_2O_3$.

5. The electrostatic chuck apparatus according to claim 1, wherein the yttrium aluminum oxide composite oxide is one or more selected from the group consisting of yttrium aluminum garnet (YAG: Y3Al5O12), YiCb'AkCb and Y2O3-Al2O3.

6. An electrostatic chuck apparatus comprising:
an electrostatic chuck portion having a mounting plate made of a corrosion-resistant ceramic which has one main surface used as a mounting surface on which a plate-like specimen is mounted, a supporting plate which is integrated with the mounting plate so as to support the mounting plate and is made of an insulating ceramic having a larger thermal conductivity than the corrosion-resistant ceramic, and an internal electrode for electrostatic adsorption provided between the mounting plate and the supporting plate; and
a temperature-controlling base portion which adjusts the electrostatic chuck portion to a desired temperature,
wherein the corrosion-resistant ceramic is composed of one or more selected from a group of yttrium aluminum garnet (YAG: $Y_3Al_5O_{12}$), $Y_2O_3 \cdot Al_2O_3$, $Y_2O_3$—$Al_2O_3$, and rare earth element-added yttrium aluminum oxide composite oxides,
thickness of the mounting plate is 0.3 mm to 2.0 mm,
the supporting plate is composed of one or more selected from a group of aluminum oxide ($Al_2O_3$), aluminum nitride (AlN), aluminum oxide-silicon carbide ($Al_2O_3$—SiC), aluminum nitride (AlN) including 3 mass % to 7 mass % of yttrium oxide ($Y_2O_3$),
an insulating adhesive layer is provided between the supporting plate and the internal electrode, having a variation in the in-plane thickness within 10 μm, and
wherein the additive ratio of the rare earth element (RE) or the oxide of the rare earth element (RE) added to the yttrium aluminum oxide composite oxide in the rare earth element (RE)-added yttrium aluminum oxide composite oxide ranges from 0.01 mass % to 20 mass % with respect to the total amount of the yttrium aluminum oxide composite oxide.

7. The electrostatic chuck apparatus according to claim 1, wherein the internal electrode for electrostatic adsorption is formed of one or more selected from the group consisting of an aluminum oxide-tantalum carbide ($Al_2O_3$—$Ta_4C_5$) conductive composite sintered compact, an aluminum oxide-tungsten ($Al_2O_3$—W) conductive composite sintered compact, an aluminum oxide-silicon carbide ($Al_2O_3$-SiC) conductive composite sintered compact, an aluminum nitride-tungsten (AlN—W) conductive composite sintered compact, an aluminum nitride-tantalum (AlN-Ta) conductive composite sintered compact , an yttrium oxide-molybdenum ($Y_2O_3$—Mo) conductive composite sintered compact, tungsten (W), tantalum (Ta) and molybdenum (Mo).

8. The electrostatic chuck apparatus according to claim 1, wherein the internal electrode for electrostatic adsorption has a thickness ranging from 0.1 μm to 100 μm.

9. The electrostatic chuck apparatus according to claim 1, wherein the insulating adhesive layer is composed of a sheet-like or film-like adhesive resin made of a polyimide resin, a silicone resin or an epoxy resin.

10. The electrostatic chuck apparatus according to claim 1, wherein the insulating adhesive layer has a thickness ranging from 10 μm to 100 μm.

11. The electrostatic chuck apparatus according to claim 1, wherein the thickness of the electrostatic chuck portion has a thickness ranging from 0.7 mm to 5.0 mm.

12. An electrostatic chuck apparatus comprising:
an electrostatic chuck portion having a mounting plate made of a corrosion-resistant ceramic which has one main surface used as a mounting surface on which a plate-like specimen is mounted, a supporting plate which is integrated with the mounting plate so as to support the mounting plate and is made of an insulating ceramic having a larger thermal conductivity than the corrosion-resistant ceramic, and an internal electrode for electrostatic adsorption provided between the mounting plate and the supporting plate; and
a temperature-controlling base portion which adjusts the electrostatic chuck portion to a desired temperature,
wherein the corrosion-resistant ceramic is composed of one or more selected from a group of yttrium aluminum oxide composite oxides, rare earth element-added yttrium aluminum oxide composite oxides, and yttrium oxides,
thickness of the mounting plate is 0.3 mm to 2.0 mm,
the supporting plate is composed of one or more selected from a group of aluminum oxide ($Al_2O_3$), aluminum nitride (AlN), aluminum oxide-silicon carbide ($Al_2O_3$—SiC), aluminum nitride (ALN) including 3 mass % to 7 mass % of yttrium oxide ($Y_2O_3$),
an insulating adhesive layer is provided between the supporting plate and the internal electrode, having a variation in the in-plane thickness within 10 μm, and
wherein the electrostatic chuck apparatus is equipped with a heater element which is embedded in an organic insulating adhesive layer provided between the supporting plate and the temperature-controlling base portion, and the organic insulating adhesive layer contains a filler made of surface-coated aluminum nitride (AlN) particles in which a coated layer made of silicon oxide ($SiO_2$) is formed on the surface of aluminum nitride particles.

13. The electrostatic chuck apparatus according to claim 1, wherein the mounting plate is made of a yttrium oxide ($Y_2O_3$) sintered compact, and the supporting plate is made of an aluminum oxide ($Al_2O_3$) sintered compact.

14. The electrostatic chuck apparatus according to claim 1, wherein the mounting plate is made of a yttrium aluminum garnet (YAG), and the supporting plate is made of an aluminum oxide ($Al_2O_3$) sintered compact.

15. The electrostatic chuck apparatus according to claim 1, wherein the mounting plate is made of a samarium oxide ($Sm_2O_3$)-added yttrium aluminum garnet (YAG.Sm), and the supporting plate is made of an aluminum oxide ($Al_2O_3$) sintered compact.

16. The electrostatic chuck apparatus according to claim 1, wherein the mounting plate is made of a gadolinium oxide ($Gd_2O_3$)-added yttrium aluminum garnet (YAG.Gd), and the supporting plate is made of an aluminum oxide ($Al_2O_3$) sintered compact.

* * * * *